United States Patent [19]

Kaneko et al.

[11] Patent Number: 4,915,723
[45] Date of Patent: Apr. 10, 1990

[54] APPARATUS FOR CASTING SILICON WITH GRADUAL COOLING

[75] Inventors: Kyojiro Kaneko; Jun-Ya Masuda, both of Hyogo, Japan

[73] Assignee: Osaka Titanium Co., Ltd., Hyogo, Japan

[21] Appl. No.: 374,250

[22] Filed: Jun. 30, 1989

[30] Foreign Application Priority Data

Jul. 5, 1988 [JP] Japan .................. 63-167194

[51] Int. Cl.$^4$ .......................................... C03B 37/02
[52] U.S. Cl. ...................................... 65/144; 65/18.1; 65/18.4; 65/335
[58] Field of Search .............. 65/18.4, 144, 335, 18.1, 65/18.2

[56] References Cited

U.S. PATENT DOCUMENTS

| | | | |
|---|---|---|---|
| 1,537,036 | 5/1925 | Miller | 65/18.1 X |
| 2,958,161 | 11/1960 | Palmer | 65/335 X |
| 3,261,676 | 7/1966 | Morelock | 65/18.4 |
| 3,320,045 | 5/1967 | Weiss et al. | 65/335 |
| 3,527,587 | 9/1970 | Velev et al. | 65/335 X |
| 4,617,041 | 10/1986 | Meerman | 65/18.1 X |

Primary Examiner—Arthur Kellogg
Attorney, Agent, or Firm—Oblon, Spivak, McClelland, Maier & Neustadt

[57] ABSTRACT

For the continuous casting of silicon, an electrically conductive bottomless crucible is circumferentially divided by axial slits and is positioned within an electrical induction coil. The slits form circumferential gaps of between 0.3 mm and 1.0 mm and the inner wall of the crucible is inclined by between 0.4° and 2.0°, so that the crucible expands in the downstream direction of movement of the silicon. In order to reduce the temperature gradient of the solidified silicon to between 20° C./cm and 100° C./cm, an additional heating element is disposed downstream of the boundary surface between the molten and solidified silicon. The crucible may be cooled by forming the crucible as a double walled cylinder and flowing a coolant therethrough.

20 Claims, 8 Drawing Sheets

APPARATUS FOR CASTING SILICON WITH GRADUAL COOLING

BACKGROUND OF THE INVENTION

1. Field of the Invention:

The present invention relates to an apparatus for casting silicon by an electromagnetic induction.

2. Background of the Related Art:

A method is known in which an electrically conductive bottomless crucible 6 (FIGS. 7a and 7b) divided into a plurality of parts in a circumferential direction thereof is placed in an induction coil 7 and a material 20 is gradually drawn downwards from said bottomless crucible 6 with melting within the bottomless crucible 6 and subsequent solidification. This method is hereinafter refereed to as continuous casting by electromagnetic induction.

In the continuous casting method by electromagnetic induction, since the bottomless crucible 6 is divided into a plurality of parts in the circumferential direction thereof, respective divided parts 16 are electrified by an electric current flowing through an induction coil 7 so that an electric current is generated in a material 20 within the crucible 6 to heat and melt the material 20. A repulsion is simultaneously generated between the electric current flowing through the divided parts 16 of the crucible 6 and the electric current flowing through the material 20 to maintain the material 20 in a condition that it is not brought into contact with the crucible 6.

However, in the continuous casting method by electromagnetic induction, the molten material 20 within the crucible 6 unavoidably enters gap 17 (FIGS. 8a and 8b) between the divided parts 16 of the crucible 6 and solidifies. This phenomenon is called the insertion phenomenon, which leads to difficulty in pulling down and discharge of the solidified material 20 from the inside of the crucible 6.

Accordingly, in practice, the continuous casting method by electromagnetic induction has been in the form where a slag is placed between the crucible 6 and the material 20 within the crucible 6. The continuous casting method by electromagnetic induction in which slag is put between the crucible 6 and the material 20 within the crucible 6 is called the inducto-slag melting method and has been mainly used for the melting and casting active metals such as titanium. In this method, the slag serves as a cushion material and an insulating material between the crucible 6 and the material 20 within the crucible 6. See (Note) P.G. CLITES and R.A.BEALL: *Proc. the Fifth International Conf. on Electroslag and Special Melting Technology,* (1975); P477.

On the other hand, an anisotropic solidified silicon lump used as a material for a solar cell and the like has been industrially produced by a method in which silicon is melted in a bottomed crucible in an atmosphere inert to molten silicon and then poured into a mold having a predetermined temperature gradient in the vertical direction to solidify.

However, in such a method of casting silicon, the contamination of the silicon with impurities from the crucible and mold can not be avoided. In addition, in order to suppress such contaminations, it is required that the crucible and mold are formed of special highly pure materials. This leads to a remarkable increase of casting cost and complexity of heating facilities for the mold. Furthermore, the crystallization of the silicon progresses simultaneously from both a bottom surface of the mold and a side surface of the mold, so that such the method is not preferable in view of crystallography.

In view of the above described problems, it was considered that the continuous casting method by electromagnetic induction capable of maintaining the crucible under the condition that it is not brought into contact with the material within the crucible is suitable for the casting of silicon.

The continuous casting method by electromagnetic induction has been considered for a long time but not practically used in an industrial scale until the inductoslag melting method was developed, in view of the balance against the power source facilities and electric-power cost. However, a small-sized but large-capacity power source facility has been provided as the technology has remarkably progressed recently, to reduce the electric-power cost. The continuous casting method by electromagnetic induction is again being considered as a method of casting silicon.

In the continuous casting method by electromagnetic induction, as above described, the material is not brought into contact with the bottomless crucible and in the case where it is used for the casting of silicon, the silicon can be completely prevented from being contaminated with impurities. If silicon is not contaminated with the impurities from the crucible, the grade of the material for the crucible can be lowered and the cost of facilities can be remarkably reduced in cooperation with the elimination of the mold. Thus, the continuous casting method by electromagnetic induction can continuously produce a large-sized and high-quality silicon cast lump inexpensively by combining it with the large-capacity power source apparatus. In addition, the crystallization from the side wall of the crucible can be suppressed, so that the continuous casting method by electromagnetic induction is preferable also in view of the crystallography.

The continuous casting method by electromagnetic induction is shown in Japanese Patent Laid-Open No. Sho 61-52962. In addition, in this method the temperature gradient during the cooling after the solidification of silicon is large, which generates a great thermal strain in the solidified silicon cast lump and the thermal strain leads to the generation of many cracks and crystalline defects in the silicon cast lump. As a result, the quality of the silicon cast lump is not satisfactory.

The insertion phenomenon can be solved by the supply of great electric power, but this cannot prevent the deterioration due to the thermal strain, which is a fatal disadvantage for a semi-conductor material. In addition, if the insertion phenomenon is overcome by the great electric power, the power cost is increased, so that it is desired to suppress the insertion phenomenon without using great electric power, if possible.

SUMMARY OF THE INVENTION

The present invention has as an object to provide an apparatus for continuously casting silicon by electromagnetic induction, capable of completely preventing the deterioration due to the thermal strain.

It is another object of the present invention to provide an apparatus for continuously casting silicon by electromagnetic induction, capable of preventing the insertion phenomenon without using great electric power, while also preventing said deterioration.

The above, and other objects, are achieved according to the present invention by an apparatus for casting silicon, comprising an electrically conductive bottomless crucible, at least an axial part of which is divided into a plurality of circumferentially spaced parts; an electrical induction coil surrounding the crucible, whereby silicon continuously moving through the crucible may be melted and subsequently solidified; and means for heating the solidified silicon, the means for heating being disposed downstream of a boundary surface level between the molten and solidified silicon, in a direction of movement of the silicon.

The heating means preferably comprises means for maintaining a temperature gradient in the solidified silicon, along the direction of movement and in a region where the solidified silicon has a temperature of at least 500° C., between 20° C. per centimeter and 100° C. per centimeter.

According to a further feature of the invention, the heating means are a radiant body formed from graphite, high melting point metal or electrically conductive ceramic.

According to another feature of the invention, the crucible has axial slits extending to a downstream end thereof for dividing the crucible into the plurality of circumferentially spaced parts.

According to a further feature of the invention, the crucible has a double walled construction, and inlet and outlet pipes are provided for flowing a coolant between the double walls of the crucible.

According to a further feature of the invention, the circumferentially spaced parts of the crucible are spaced by a circumferential gap of between 0.3 mm and 1.0 mm.

According to yet a further feature of the invention, the inner wall of the crucible is inclined by between 0.4° and 2.0° in the direction of movement such that the crucible expands in the downstream direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
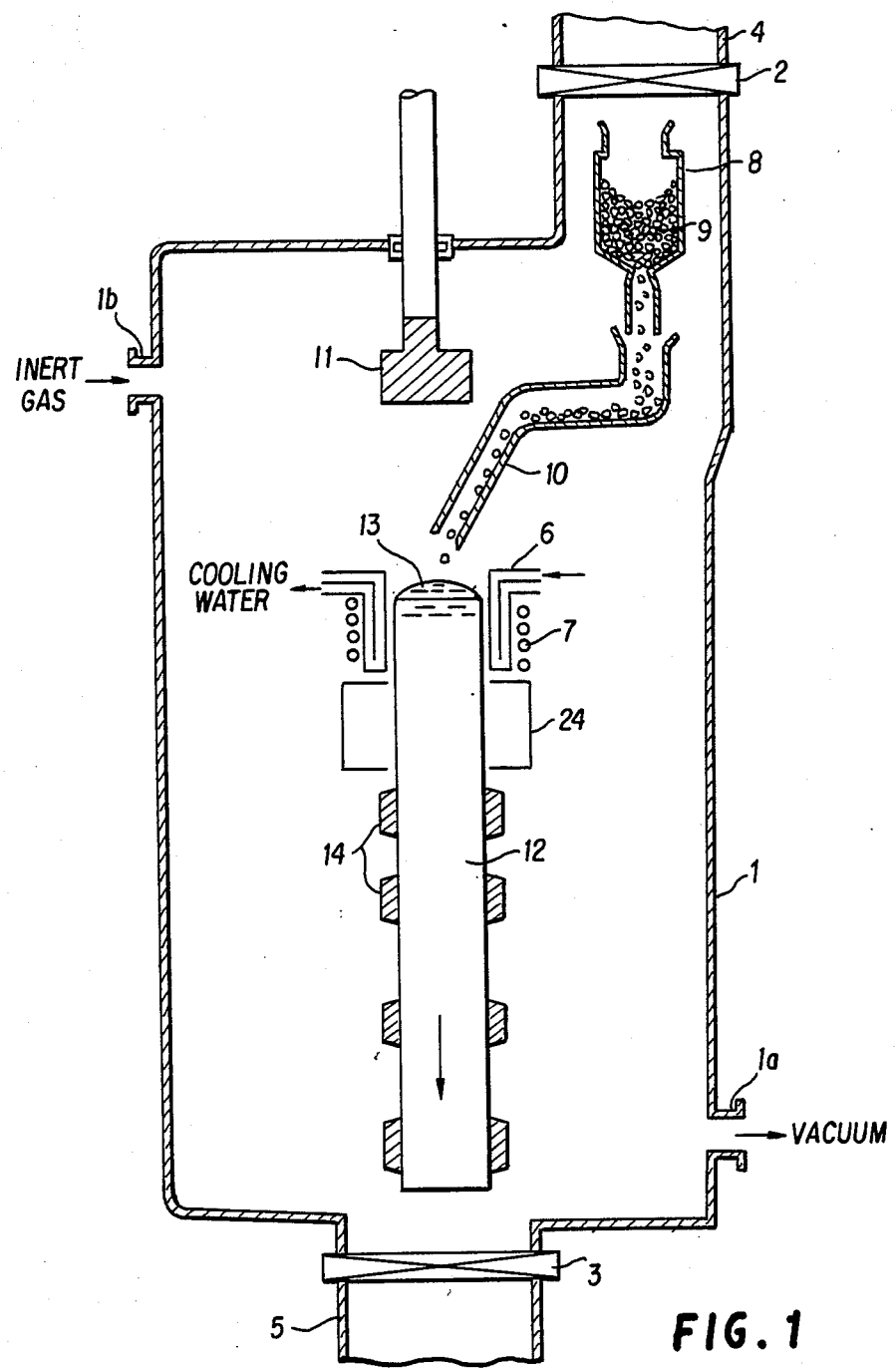
FIG. 1 is a schematic longitudinal sectional view illustrating an embodiment of the apparatus according to the present invention.

A molten silicon 13 within a bottomless crucible 6 is solidifed near a downstream or lower end level A of an induction coil 7. The temperature at a boundary surface B of the molten silicon 13 and solidified silicon 12 is 1,412° C. Solidified silicon 12 is pulled down from inside of the bottomless crucible 6 while its temperature gradually falls. A pulling-down speed of the solidified silicon 12 is usually 1 to 3 mm/min. As a rule, in the continuous casting of metals by electromagnetic induction the cast lump pulled down from the bottomless crucible is cooled.

Figure 4:
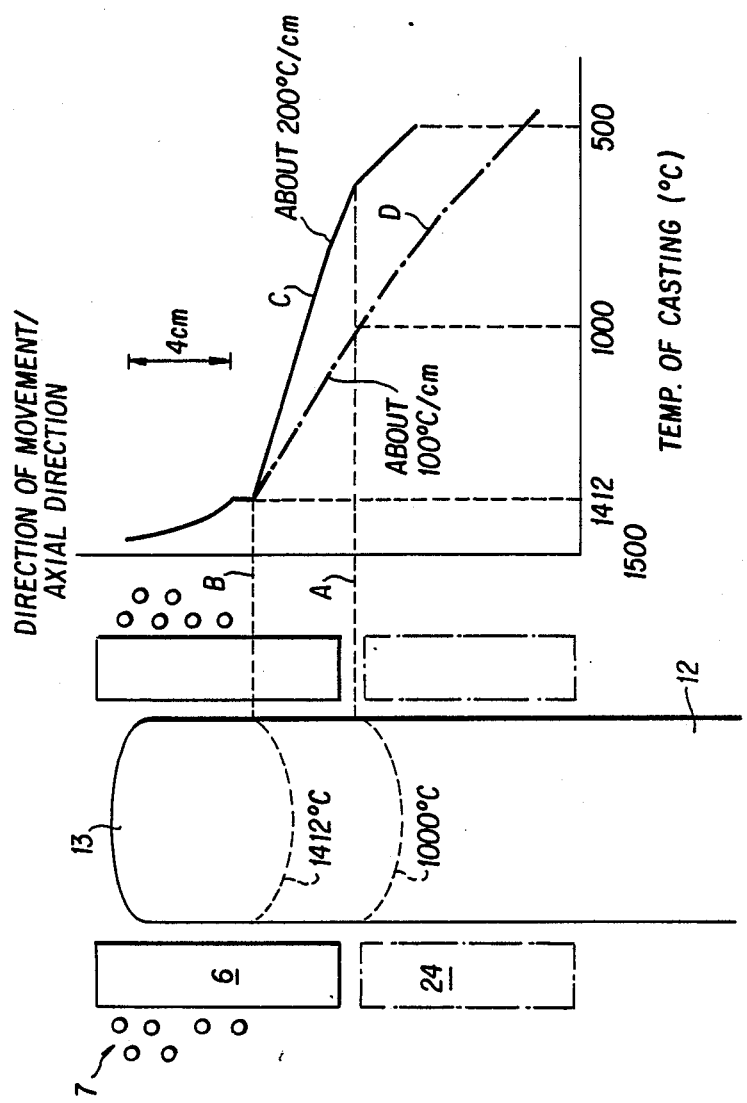
FIG. 4 is a diagram describing the axial temperature gradient of the solidified silicon.

It has been found from experiments by the present inventor that in the continuous casting of silicon by electromagnetic induction the axial temperature gradient is about 200° C./cm, even in the case where solidified silicon 12, which is pulled down from the bottomless crucible, is merely cooled naturally, as shown by a full line C in FIG. 4, to produce cracks in its solidified silicon 12, thereby making the industrial operation impossible. This is greatly influenced by the electrical resistance characteristics of silicon.

That is to say, in the case where silicon is subjected to the heating by electromagnetic induction, silicon shows a lower electrical resistance in the molten condition, which increases the heating efficiency, while it shows a higher electrical resistance in the solidified condition, which reduces the the heating efficiency. As a result, solidified silicon 12 is rapidly cooled immediately below the boundary surface B even within the bottomless crucible 6.

In the apparatus for casting silicon according to the present invention, heating means 24 are disposed below, i.e., downstream of, the above described boundary surface and the axial temperature gradient below the boundary surface is reduced, as shown by the chain line D in FIG. 4, by positively heating a portion of the solidified silicon below the boundary surface of solidifed silicon 12 by means of said heating means 24. As a result, high-quality solidified silicon 12 having no cracks can be continuously cast in an industrial scale.

It is desired that the axial temperature gradient of the solidified silicon 12 resulting from the heating means 24 amounts for 100° C./cm or less. In the case where the axial temperature gradient of solidified silicon 12 is reduced to 100° C./cm or less by means of the heating means 24, cracks can be prevented from being generated in a solidified silicon 12 block of usual size having a square section of which one side has a length of 150 mm or less. It is required that this temperature gradient is maintained from the boundary surface of the molten silicon 13 and the solidified silicon 12 to a region of the solidified silicon having a temperature no greater than 500° C. No cracks are generated in portions having temperatures lower than 500° C., even though the axial temperature gradient is not specially controlled.

Figure 5:
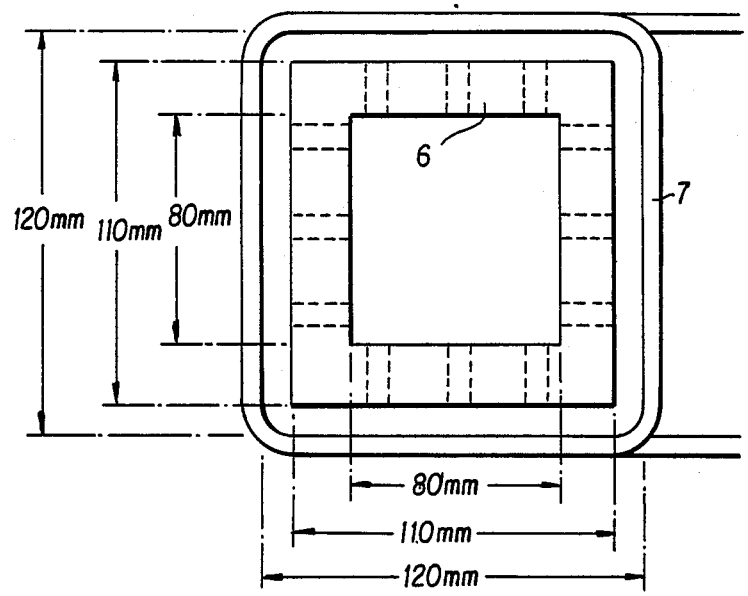
FIG. 5 is a diagram describing the dimensions of the apparatus.

Table 1 shows a relation between the axial temperature gradient in a zone (4.5 to 15 cm long) from the boundary surface B to a region of solidified silicon having temperature of 500° C., with casting conditions in which the silicon is continuously cast by means of the bottomless crucible having a regular square inner section, of which one side is 80 mm long, by electromagnetic induction. Other main conditions are as follows (refer to FIG. 5):

| Bottomless crucible 6: | |
|---|---|
| Inner side surface | Regular square of which one side is 80 mm long |
| Outer side surface | Regular square of which one side is 110 mm long |
| Height | 250 mm |
| Length of slits | 200 mm |
| Induction coil 7: | |
| Inside | Regular square of which one side is 120 mm long |
| Number of turns | 6 turns |
| Height | 70 mm |
| Heating means 24: | |
| Inside side surface | Regular square of which one side is 86 mm long |
| Height | 100 mm or 200 mm (both are used) |
| Radiant body | Molybdenum wire |

As seen in Table 1, cracks were frequently generated when the temperature gradient was 160° C./cm or more (heating means 24 not used) while the normal silicon cast lump containing no crack was produced when the temperature gradient was 100° C./cm or less (heating means 24 used).

TABLE 1

| Temperature gradient (°C/cm) | Casting condition |
|---|---|
| about 200 | Cracks was generated. |
| about 160 | Cracks were frequently generated but no crack was generated in few cases. |
| about 100 | No crack was generated. |
| about 60 | No crack was generated. |

In addition, in order to reduce the axial temperature gradient of the solidified silicon 12, it is required to increase a length of the axial temperature-controlling zone for solidified silicon 12, thereby the casting apparatus is large-sized. Accordingly, it is industrially desired that the temperature gradient amounts to 50° C./cm or more, and 25° C./cm or more in the case of solidified silicon 12 having a large size (having a square section of which one side is 200 to 300 mm long).

The direct heating means 7 for electromagnetic induction can be used as the heating means 24, but its heating efficiency in solidified silicon is low, as above described. It is instead preferred that the solidified silicon 12 is heated by the radiant indirect heating means using radiant bodies formed of graphite, electrically conductive ceramics, high-melting point metals and the like.

In addition, it is desired that the heating means 24 is disposed as closely as possible to the bottomless crucible 6 so as to heat the solidified silicon 12 from immediately below the boundary surface B. It is desired for the same reason that the slits dividing the circumferential wall of the bottomless crucible 6 into a plurality of parts in the circumferential direction extend to the downstream lower end of the bottomless crucible 6. The bottomless crucible 6 thus has electromagnetic induction heating to the lower end thereof.

As a result, solidified silicon 12 is subjected to heating not only within the bottomless crucible 6, but also after discharge from the crucible 6, so that the temperature distribution within solidified silicon 12 is gradually lowered from the heated portion within the bottomless crucible 6 to the portion heated by means of the heating means 24.

In addition, the bottomless crucible 6 may have a double walled, hollow structure to permit the flow of a coolant through the inside thereof via a conduit means. The bottomless crucible 6 can be formed of inexpensive materials having a relatively low melting point, such as copper, by so cooling the bottomless crucible 6 with the coolant.

In this case, it is preferable that the bottomless crucible 6, except the upper (upstream) portion thereof, is divided into parts in the circumferential direction and the inlet pipe and outlet pipe of the coolant conduit means are provided in the upper portion of the crucible, where no division is made. With such a bottomless crucible, the slits dividing the bottomless crucible 6 in the circumferential direction extend to the lower end of the crucible and the number of pipes for introducing, circulating and discharging the coolant can be reduced.

Water is effectively used as the coolant due to its inexpensiveness and superior heat conduction.

It is also important in the industrial casting of silicon by the continuous casting method by electromagnetic induction that the insertion phenomenon can be prevented without supplying great electric power. In addition, even if the insertion phenomenon cannot be suppressed, if the smooth pulling-down of the solidified silicon can be achieved, the supply of great electric power becomes unnecessary. The present inventor has investigated concrete measures for the control of the gaps and has found that the control of the circumferential gaps between the divided parts in the circumferential direction of the bottomless crucible is effective for minimizing the insertion and the control of the angle of the inner wall surface of the crucible is effective in reducing the pulling force.

That is to say, if the gaps between the divided parts in the circumferential direction of the bottomless crucible are 1.0 mm or less wide, the electric current flowing through the inner wall surface of the crucible is opposite in direction to the electric current flowing through the outer portion of molten silicon within the crucible, so that the repulsion generated between both electric currents continuously acts in the gaps between the divided parts, so that the insertion phenomenon can be effectively suppressed.

Figure 6:
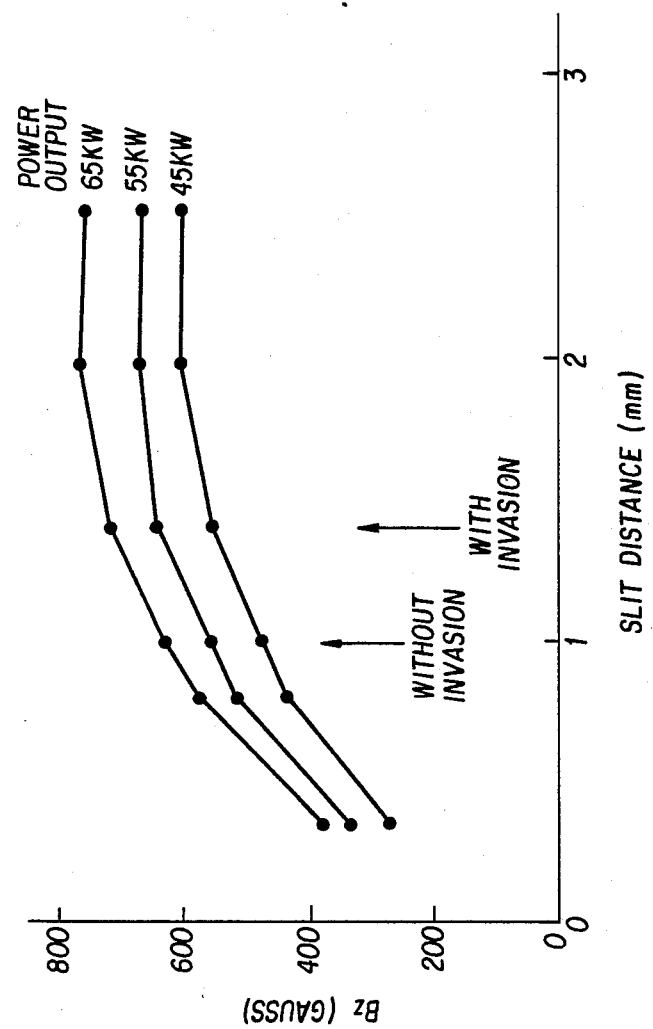
FIG. 6 is a graph quantitatively showing the influences of the width of the gaps between the divided parts of the bottomless crucible and the high-frequency power source output upon the insertion phenomenon.

FIG. 6 is a graph showing a relation between the measured values of the central magnetic field within the bottomless crucible for a high-frequency power source apparatus of 30 KHz, in the case where silicon is continuously cast by means of the bottomless crucible having a regular square inner section, of which one side is 80 mm long, by electromagnetic induction. In this case, as shown by an arrow in said graph, no insertion phenomenon occurs when the width of the gaps between the divided parts is 1.0 mm while the insertion phenomenon occurs when the width of the gaps between the divided parts amounts to 1.4 mm.

As to the width of the gaps between the divided parts, it was observed that the magnetic field within the crucible was reduced with a reduction of the width of the gaps between the divided parts. This can be understood as follows. The electric current flows merely in the vicinity of the surface within the divided parts of the crucible under the alternating magnetic field. This surface electric current generates a magnetic field in space. The magnetic field generated by the surface electric current acts as a force generating an electric current in the same direction as that of the electric current flowing through the divided parts of the crucible facing the gaps between the divided parts. Thus, the electric current within the divided parts of the crucible is biassed and as a result, the magnitude of the magnetic field within the crucible is reduced. The same phenomenon as this change of the magnetic field by the gaps between the divided parts is produced also between the inner wall of the crucible and the molten silicon. In the range where the gaps between the divided parts are wide (1.4 mm or more), the repulsion between molten silicon and the divided parts of the crucible is reduced. As a result, the insertion of molten silicon into the gaps between the divided parts of the crucible becomes notable.

However, if the width of the gaps between the divided parts is less than 0.3 mm, the electric current generated in the divided parts of the crucible rapidly reduces the efficiency of the electric current induced in the molten silicon within the crucible, so that the needless consumption of electric power is brought about, thereby leading to the impossibility of economical melting.

Figure 7A:
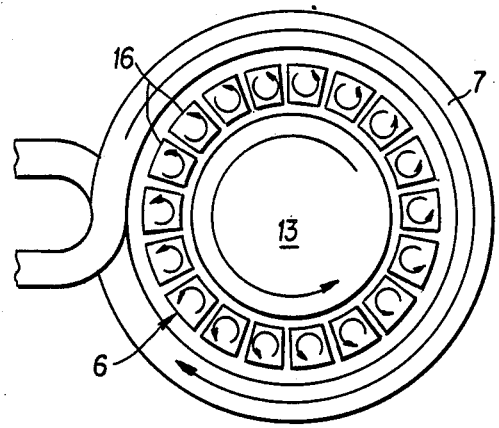
FIGS. 7a and 7b are respectively a plan view and a longitudinal sectional view showing the basic principle of a conventional continuous casting method by electromagnetic induction.
Figure 7B:
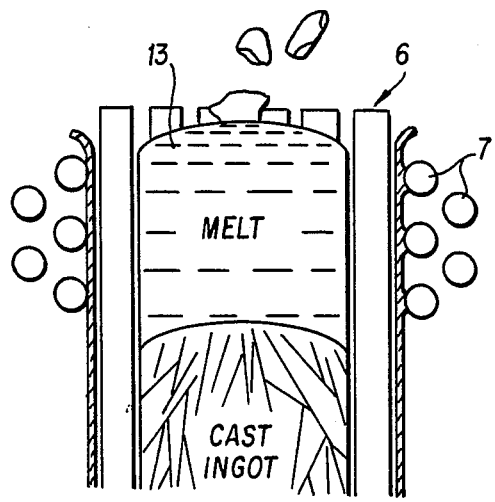
Figure 8A:
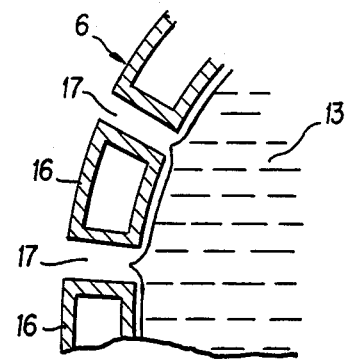
FIGS. 8a and 8b are respectively a cross sectional view and a longitudinal sectional view showing the inserting phenomenon.
Figure 8B:
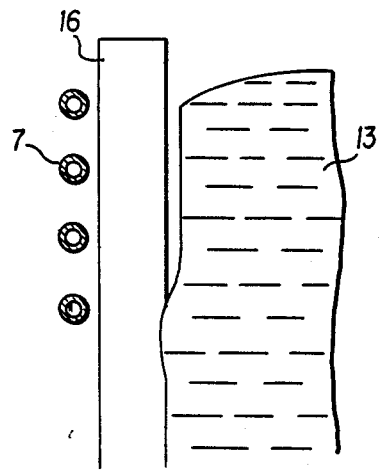

In addition, as shown in FIG. 7(b), it was observed that the insertion phenomenon became most notable in the lower portion of the induction coil 7. It seems that this results from a vertical force applied to the molten silicon 13 within the crucible 6 by its own weight, which is increased toward the lower portion of the molten silicon 13. Accordingly, if an axial inclination expanding outwards in the downstream or downward direction is given to the inner wall surface of the crucible 6, molten silicon 13 can be pulled down even though the insertion phenomenon is brought about.

Table 2 shows the relation between the axial angle of inclination and the possibility of pulling down the cast lump in the case where silicon having a diameter of 50 mm is continuously cast by electromagnetic induction and the width of the gaps between the divided parts of the crucible is 1.0 mm, using standard electric power (45 to 55 kW).

TABLE 2

| Angle of inclination of the inner wall surface of the crucible | Judgment about the possibility of pulling down the cast lump |
| --- | --- |
| 0.2° | x (no) |
| 0.4° | o (ok) |
| 1.0° | o (ok) |
| 2.0° | o (ok) |
| 5.0° | o (ok) |

As obvious from Table 2, if said angle of inclination is 0.4° or more, the cast lump can be pulled down.

However, if said angle of inclination exceeds 2.0°, the diameter of the lower portion of the crucible is excessively increased, so that, when the cast lump-pulling down speed is increased, molten silicon falls drop by drop from the solid phase-liquid phase boundary surface B on the side surface of the cast lump before molten silicon is solidified, and the continuous solidification of the cast lump becomes impossible.

FIG. 1 is a longitudinal sectional view schematically showing one example of an apparatus for casting silicon according to the present invention.

A airtight vessel 1 is a water cooled vessel having a double structure to protect the vessel from the heating therewithin. Said airtight vessel 1 is provided with a vacuum exhaust pump connected thereto through a duct 1a for degassing the inside of the vessel and a supply pipe 1b of inert gases for controlling a partial pressure of said inert gases within the vessel at a predetermined pressure.

This airtight vessel 1 has a material charging vessel 4 and a cast lump-taking out chamber 5, partitioned by vacuum-cutting off devices 2, 3 provided at an upper portion and lower portion thereof, so that the charging of materials and the taking-out of the cast lump may be conducted while maintaining the silicon within the airtight vessel 1 in an inert atmosphere.

A bottomless crucible 6 fixedly mounted near the central axis of the airtight vessel 1 is surrounded by an induction coil 7 and provided with heating means 24 positioned below a lower portion thereof. The construction of this portion will be in further described later with reference to FIG. 2. A material hopper 8 is provided below the material-charging vessel 4 within the airtight vessel 1 so that granular and lumpy material silicon 9 charged in said hopper 8 may be added to the molten silicon 13 within the bottomless crucible 6 through a rotary charging duct 10.

A resistive radiant body 11 formed of graphite and the like is vertically movably provided immediately above the bottomless crucible 6 so as that it can be lowered into the bottomless crucible 6.

A conventional supporting and drawing device 14 for supporting and pulling down a silicon cast lump 12 is provided below the heating means 24.

A clamp-roll type supporting and drawing device 14 may be used but it is preferable in view of the influence upon the silicon cast lump 12 to use a plurality of clamp bodies which hold the silicon cast lump 12 without slipping and descend by a predetermined distance followed by releasing the silicon cast lump 12 and ascending until the original position, the clamp bodies being simultaneously driven but differing in phase.

In addition, it is possible to provide a cutting device for cutting the silicon cast lump 12 by laser beams and the like within the vessel 1.

Figure 2:
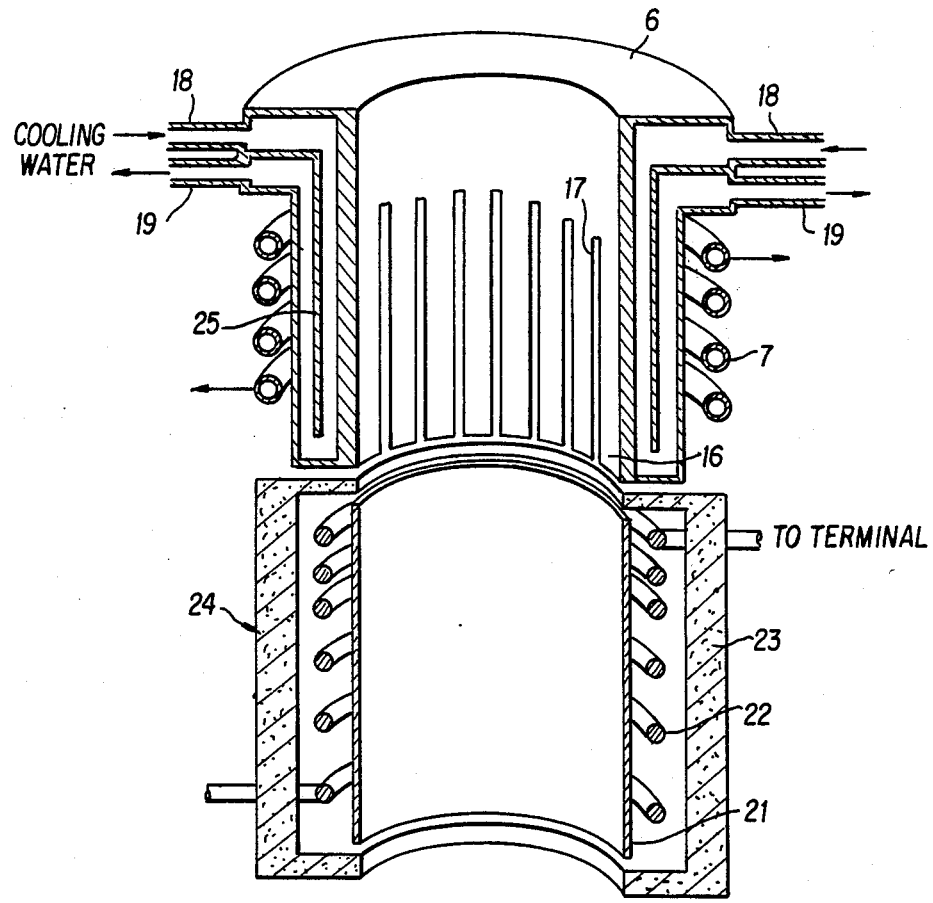
FIG. 2 is a perspective view showing an embodiment of the bottomless crucible and heating means which are principal parts of the apparatus according to the present invention.

FIG. 2 shows an example of the construction of the bottomless crucible and the heating means which are principal parts of the apparatus for casting silicon according to the present invention.

The bottomless crucible 6 is formed of a cylindrical member made of copper having such a construction that it is divided into a plurality of parts in the circumferential direction, excepting an upper portion. An inside of the crucible is partitioned by means of a partition plate 25 to form an inside and an outside so that a coolant, which has been introduced into the crucible through an inlet pipe 18, may descend along the inside portion while circulating in the circumferential direction to cool the inner wall surface and then ascend along the outside portion to be collected in an outlet pipe 19, followed by discharging out of the crucible 6. With the crucible having such construction, the number of pipes can be reduced, so that the apparatus is economical.

This bottomless crucible 6 has a construction in which a width of gaps between the divided parts 16 formed in the circumferential direction thereof amounts for 0.3 to 1.0 mm and/or the inner wall surface of the crucible expands outwards at an angle of 0.4 to 2° in the downward direction.

Although the bottomless crucible 6 is divided in the circumferential direction, excepting the upper portion thereof, the lower portion may also be excepted or the crucible may be divided in the circumferential direction over the entire axial direction.

In addition, the shape of the bottomless crucible 6 is not limited to be a cylinder section cylinder but may be a square section cylinder. As to the material, electrically conductive materials other than copper can be used.

The induction coil 7 is concentrically provided outside of the bottomless crucible 6 and connected to a power source via a coaxial cable (not shown). The induction coil 7 and the coaxial cable are cooled by means of the same cooling means.

The heating means 24 is concentrically and communicatingly provided below the bottomless crucible 6. A metallic resistance radiant body 22 is wound around an outside of a cylindrical shelter-plate 21 formed of a silica pipe. An upper portion of the radiant body 22 is closely wound in comparison to a lower portion thereof. The metallic resistance radiant body 22 is covered by a heat insulating furnace wall 23 mainly comprising alumina.

The radiant body 22 may be divided into a plurality of blocks in the vertical direction so as to permit one to independently control the heating in the vertical direction.

Figure 3A:
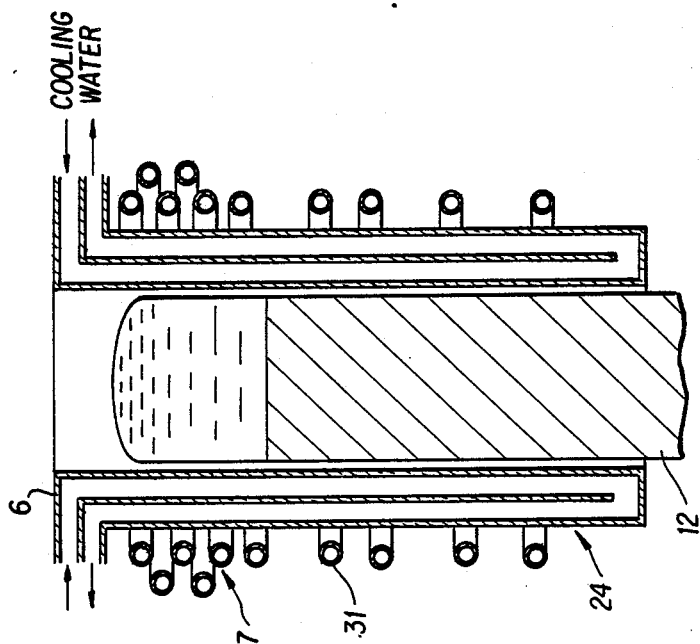
FIGS. 3a and 3b are longitudinal sectional views showing other examples of the construction of the heating means.
Figure 3B:
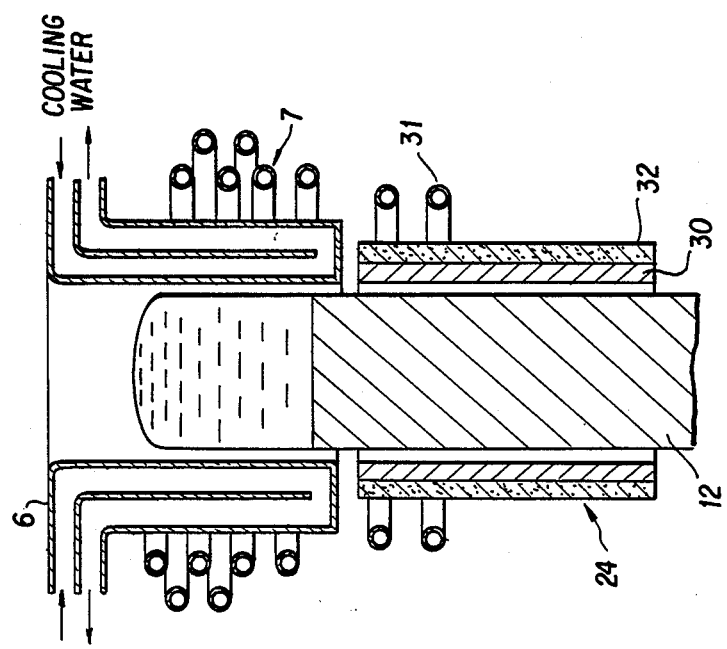

FIGS. 3a and 3b show other examples of the heating means 24.

The heating means 24 shown in FIG. 3a comprises a cylindrical electrical conductor 30 provided concentrically and communicatingly immediately below the bottomless crucible 6 and a second induction coil 31 provided around an outside of said cylindrical conductor 30, an outer surface of the conductor 30 being covered with a heat insulating wall 32. Said second induction coil 31 may be electrified by the power source used also for the induction coil 7 or by an independent power source. For example graphite, Ta, Mo and the like are selected as materials for the conductor 30 and, for example, graphite fiber molded body, alumina and the like are used as materials for the heat insulating wall 32. The heating means 24 shown in FIG. 3(b) is a downward extension of the bottomless crucible 6. Also the second induction coil 31 wound around the extended portion for heating solidified silicon may be electrified by the power source used also for the induction coil 7 or an independent power source, in the same manner as in the example shown in FIG. 3(a). In the case where the power source used also for the induction coil 7 is used, it is necessary that the second induction coil 31 can be controlled independently from the induction coil 7. Whichever heating means 24 is used, the desired axial temperature gradient is given to silicon immediately after solidified to prevent a thermal strain due to sudden cooling from being produced.

A method of casting silicon by the use of the apparatus shown in FIGS. 1 and 2 will be below described.

At first, the inside of the airtight vessel 1 is evacuated and then filled with an argon gas as the inert gas, followed by placing a cylindrical seed cast lump formed of silicon in the supporting and drawing device 14 so that the upper end of the seed cast lump may be positioned at the center, in the direction of height, of the bottomless crucible 6.

Next, the radiant body 11 formed of graphite and the like is lowered to the bottomless crucible 6 while the charging duct 10, which is provided above the bottomless crucible 6, is moved sideways to be positioned close to and immediately above the seed cast lump. The induction coil 7 is then actuated.

When an upper end surface of the seed cast lump within the induction coil 7 is molten, the radiant body 11 is raised to its original position, the seed cast lump is raised within the crucible 6, and the initial formation of molten silicon is complete.

After the initial formation of the molten silicon, granular silicon material 9 is immediately added to a molten surface of molten silicon 13 through the charging duct 10 to melt the silicon material 9 and the supporting and drawing device 14 is operated while the heating means 24 is operated to pull down the silicon cast lump 12 including the seed cast lump from the bottomless crucible 6 and the heating means 24.

Thus, molten silicon 13 is pulled away from a region receiving the electromagnetic force to continuously solidify and the desired axial temperature gradient is given to the portion 12 which has just been solidified, by means of the heating means 24.

A high-quality anisotropic silicon cast lump having no thermal strain can be produced by continuing the above described continuous material-charging, melting and solidifying operation.

The produced silicon cast lump 12 is transferred to the cast lump-taking out chamber 5 by releasing the vacuum-cutting off device 3 and taken out of the cast lump-taking out chamber 5 after the vacuum-cutting off device 3 is closed.

The desired amount of silicon material 9 is supplied in the hopper 8 from the charging vessel 4 by releasing the vacuum-cutting off device 2 and, after adding silicon material to the vessel 1, by closing the vacuum-cutting off device 2 again.

The results of the actual casting by the above described procedure are described below.

A water-cooled bottomless crucible 6 was made of copper and had a circular sectional shape, an inside diameter of 55 mm, an outside diameter of 85 mm, 12 divided parts in the circumferential direction, the width of the gaps between the divided parts being 1.0 mm and the height of the divided parts being 1.0 mm and the height of the divided parts being 150 mm. The inner wall of this bottomless crucible 6 had an axial downward inclination expanding outwards at an angle of 0.75°. An induction coil 7 had 6 turns, an inside diameter of 100 mm, an outside diameter of 115 mm, a height of 60 mm and an induction frequency of 20 kHz. A suitable high-frequency power source output of 45 to 50 KW was used and a continuous pulling-down speed was 1.5 mm/min when the silicon was molten and continuously cast.

In addition, the heating means 24 had the construction shown in FIG. 2; that is, the effective heating portion was cylindrical in shape and had an inside diameter of 60 mm and a height of 150 mm. The temperature at the lower end was controlled to be 500° C. A gently-sloping temperature gradient of 40° C./cm from the boundary surface to the lower end of the heating means 24 was given to the thus produced solidified silicon 12. The above Table 2 shows the results of the casting under the above described conditions.

In addition, a circular substrate having a diameter of 50 mm and a thickness of 0.35 mm was cut out from the cast lump and the circular substrate was not broken by the cutting operation. This showed that no thermal strain remained in the cast lump. It was found by the measurement of the diffusion length of this circular semiconductor substrate that the diffusion length of the P type semiconductor amounted to between 200 and 300 microns at 1 ohm cm. Thus, a polycrystalline semiconductor produced by the apparatus and method according to the present invention can be satisfactorily used as a substrate in a solar cell.

Another example of the invention having the construction shown in FIG. 3a is below described. The bottomless crucible 6 was made of copper and cooled with water and had a regular square sectional shape of which one side was 80 mm long. The number of the divided parts was 20, the width of the gaps between the divided parts was 1.0 mm, the height of the divided parts was 200 mm from the lower end of the crucible and the angle of the inclination, expanding axially downwards, of the inner wall was 0.75°. The induction coil 7 incorporated in this bottomless crucible 6 was a regular shape loop of which one side on the inner surface was 120 mm long. The number coils 7 was 6, the height was 70 mm and one side had an outside diameter of 150 mm.

A molten pool of silicon having a regular square section, of which one side was 80 mm long and having a height of 70 mm was formed within the bottomless crucible by actuating the induction coil 7 with an alternating current having a frequency of 30 KHz supplied from the high-frequency power source.

The conductor 30 formed of molybdenum and having a regular square section, with inner sides having a length of 86 mm, outer sides having a length of 100 mm, and having a height of 200 mm, was placed immediately below the above described bottomless crucible 6. A graphite molded body having a thickness of 15 mm was wound around the outside of the molybdenum conductor as the heat insulating wall 32. In addition, the second induction coil 31 having an inner regular square section, of which one side was 140 mm long, an outside diameter was 170 mm and a height was 15 mm, was wound around the outside of said heat insulating wall 32 with adjusting of its height to the upper end of the heating means 24. In the case where the first induction coil 7 was connected to the second induction coil 31 in series and silicon was continuously cast and pulled down at the speed of 1.5 mm/min, the required output was 70 to 80 KW.

In this case, the heating and heat insulating effect for the cast lump by the heating means 24 was such that the surface temperature of the conductor 30 was 1,150 to 1,200° C. at the upper end of the heating means 24 and about 500° C. at the lower end of the heating means 24, and a gently-inclining temperature gradient of 50° C./cm was given to solidified silicon 12 from the boundary surface to the lower end of the heating means 24.

Semiconductor characteristics such as the diffusion length being 200 to 300 microns were obtained for the polycrystalline substrate according to the present invention, and thus it was found that the polycrystalline substrate made according to the present material was useful in a solar cell.

The apparatus for casting silicon according to the present invention can produce a high-quality and inexpensive silicon cast lump without producing thermal strain which has been fatal to semiconductors, by the continuous casting of silicon b electromagnetic induction.

In addition, the insertion phenomenon can be suppressed to such an extent that there is no difficulty in pulling down the solidified silicon without supplying a great electric power, by regulating the width of the gaps between the divided parts of the bottomless crucible.

Furthermore, solidified silicon can be smoothly pulled down by giving an axial inclination to the inner wall surface of the bottomless crucible even if the insertion phenomenon occurs.

As a result, the continuous casing of silicon by electromagnetic induction can be economically and efficiently conducted in an industrial scale, to greatly reduce the casting cost of silicon.

Obviously, numerous modifications and variations of the present invention are possible in light of the above teachings. It is therefore to be understood that within the scope of the appended claims, the invention may be practiced otherwise than as specifically described herein.

WHAT IS CLAIMED AS NEW AND DESIRED TO BE SECURED BY LETTERS PATENT OF THE UNITED STATES IS:

1. An apparatus for casting silicon, comprising:
   an electrically conductive bottomless crucible, at least an axial part of said crucible being divided into a plurality of circumferentially spaced parts;
   an electrical induction coil surrounding said crucible, whereby silicon continuously moving through said crucible may be melted and subsequently solidified; and
   means for heating said solidified silicon, said means for heating being disposed downstream of a boundary surface level between said molten and solidified silicon, in a direction of movement of said silicon, whereby a temperature gradient in said solidified silicon in the direction of movement is reduced.

2. The apparatus of claim 1 wherein said heating means comprises means for maintaining the temperature gradient in said solidified silicon along said direction of movement and in a region where said solidified silicon has a temperature of at least 500° C., of between 20° C./cm and 100° C./cm.

3. The apparatus of claim 1 wherein said heating means is a radiant heating means positioned downstream of said crucible.

4. The apparatus of claim 3 wherein said radiant heating means comprises a radiant body formed of one from the group consisting of graphite, a high melting point metal and an electrically conductive ceramic.

5. The apparatus of claim 1 including axial slits in said crucible and extending to a downstream end of said crucible for dividing said crucible into the plurality of circumferentially spaced parts.

6. The apparatus of claim 1 wherein said crucible comprises a double walled cylinder, including conduit means for flowing a coolant between the double walls of said crucible.

7. The apparatus of claim 6 wherein said conduit means includes inlet and outlet conduits connected to an undivided upstream end of said crucible.

8. The apparatus of claim 1 wherein said circumferentially spaced parts of said crucible are spaced by a circumferential gap of between 0.3 mm and 1.0 mm.

9. The apparatus of claim 1 wherein an inner wall of said crucible is inclined by between 0.4° and 2.0° in said direction of movement such that said crucible expands in the downstream direction.

10. The apparatus of claim 9 wherein an inner wall of said crucible is inclined by between 0.4° and 2.0° in said direction of movement such that said crucible expands in the downstream direction.

11. The apparatus of claim 2 wherein said heating means is a radiant heating means positioned downstream of said crucible.

12. The apparatus of claim 11 wherein said radiant heating means comprises a radiant body formed of one from the group consisting of graphite, a high melting point metal and an electrically conductive ceramic.

13. The apparatus of claim 2 including axial slits in said crucible and extending to a downstream end of said crucible for dividing said crucible into the plurality of circumferentially spaced parts.

14. The apparatus of claim 2 wherein said crucible comprises a double walled cylinder, including conduit means for flowing a coolant between the double walls of said crucible.

15. The apparatus of claim 14 wherein said conduit means includes inlet and outlet conduits connected to an undivided upstream end of said crucible.

16. The apparatus of claim 2 wherein said circumferentially spaced parts of said crucible are spaced by a circumferential gap of between 0.3 mm and 1.0 mm.

17. The apparatus of claim 2 wherein an inner wall of said crucible is inclined by between 0.4° and 2.0° in said direction of movement such that said crucible expands in the downstream direction.

18. The apparatus of claim 17 wherein an inner wall of said crucible is inclined by between 0.4° and 2.0° in said direction of movement such that said crucible expands in the downstream direction.

19. The apparatus of claim 9 wherein said downstream direction is downward.

20. The apparatus of claim 9 including means positioned downstream of said heating means for pulling said solidified silicon in the downstream direction.

* * * * *

UNITED STATES PATENT AND TRADEMARK OFFICE
CERTIFICATE OF CORRECTION

PATENT NO. : 4,915,723
DATED : 04/10/90
INVENTOR(S) : KYOJIRO KANEKO and JUN-YA MASUDA It is certified that error appears in the above-identified patent and that said Letters Patent is hereby corrected as shown below:

Column 1, line 8, delete "an";

Column 1, line 17, change "refereed" to --referred--;

Column 2, line 38, delete "the";

Column 2, line 51, change "semi-conductor" to --semiconductor--;

Column 3, line 19, change "are" to --is--;

Column 7, line 65, change "A" to --An--;

Column 11, line 17, after "number" insert --of--;

Column 11, line 63, change "b" to --by--.

Signed and Sealed this

Seventh Day of January, 1992

Attest:

HARRY F. MANBECK, JR.

*Attesting Officer*   *Commissioner of Patents and Trademarks*